United States Patent
Rusu et al.

(10) Patent No.: US 7,235,281 B2
(45) Date of Patent: Jun. 26, 2007

(54) METHOD FOR THE CLOSURE OF OPENINGS IN A FILM

(75) Inventors: Cristina Rusu, Mölndal (SE); Ann Witvrouw, Herent (BE)

(73) Assignee: Interuniversitair Microelektronica Centrum (IMEC), Leuven (BE)

( * ) Notice: Subject to any disclaimer, the term of this patent is extended or adjusted under 35 U.S.C. 154(b) by 566 days.

(21) Appl. No.: 10/745,281

(22) Filed: Dec. 22, 2003

(65) Prior Publication Data
US 2004/0224091 A1    Nov. 11, 2004

Related U.S. Application Data

(60) Provisional application No. 60/439,579, filed on Jan. 9, 2003.

(30) Foreign Application Priority Data
Dec. 24, 2002    (EP) .................................. 02447270

(51) Int. Cl.
*C23C 16/00*    (2006.01)
(52) U.S. Cl. .................................. 427/248.1; 427/250
(58) Field of Classification Search ............. 427/248.1, 427/250; 257/684
See application file for complete search history.

(56) References Cited

U.S. PATENT DOCUMENTS

| | | | |
|---|---|---|---|
| 5,011,793 A | | 4/1991 | Obinata |
| 5,962,923 A | | 10/1999 | Xu et al. |
| 6,045,666 A | | 4/2000 | Satitpunwaycha et al. |
| 6,136,095 A | | 10/2000 | Xu et al. |
| 6,139,697 A | * | 10/2000 | Chen et al. ............ 204/192.15 |
| 6,159,762 A | | 12/2000 | Scheiter et al. |
| 6,217,721 B1 | | 4/2001 | Xu et al. |
| 6,218,277 B1 | * | 4/2001 | Hamamoto ................. 438/597 |
| 6,238,533 B1 | | 5/2001 | Satitpunwaycha et al. |
| 6,337,499 B1 | * | 1/2002 | Werner ....................... 257/329 |
| 6,358,616 B1 | * | 3/2002 | Jennings ..................... 428/450 |
| 2002/0089027 A1 | | 7/2002 | Xu et al. |

FOREIGN PATENT DOCUMENTS

DE    198 10 286 A1    9/1999

(Continued)

OTHER PUBLICATIONS

Ito, et al., "Influence of Ti, TiN and TiSi $_{2.4}$ underlayers on Al-Si-Cu reflow sputtering", 1994 VMIC Conference, pp. 336-342, (Jun. 7-8, 1994).

(Continued)

*Primary Examiner*—Timothy Meeks
*Assistant Examiner*—Kelly M. Stouffer
(74) *Attorney, Agent, or Firm*—Knobbe, Martens, Olson & Bear, LLP

(57) ABSTRACT

A method is described for closing openings in a film, for example, in microelectronic process technology, whereby substantially no deposition material passes through the openings, which can be important if fragile micro devices are positioned under the openings. The closure of these openings can cause an underlying cavity to be hermetically sealed, in which an object can be located. In particular the method provides a way for hermetically sealing cavities under controlled atmosphere and pressure in the encapsulation and sealing processes of cavities comprising fragile content. The cavities may comprise for example Micro Electro Mechanical Systems (MEMS). The method may be used for encapsulating devices which may require a controlled atmosphere and pressure encapsulation such as micro accelerometers, micro gyroscopes, micro tubes, vibration micro sensors, micro mirrors, micro mechanical resonators or "resonant strain gauges", micro mechanical filters, micro switches, micro electrical circuits, micro relays, Integrated Circuits with air gaps etc.

34 Claims, 8 Drawing Sheets

FOREIGN PATENT DOCUMENTS

| | | |
|---|---|---|
| EP | 0 783 108 A1 | 7/1997 |
| EP | 0783108 A1 * | 7/1997 |
| WO | 98/23935 | 6/1998 |

OTHER PUBLICATIONS

Lui, et al., "Sealing of micromachined cavities using chemical vapor deposition methods: characterization and optimization", IEEE Journal of Microelectromechanical Systems, vol. 8, No. 2, pp. 135-145, (Jun. 1999).

Tilmans, et al., "The indent reflow sealing (IRS) technique-a method for the fabrication of sealed cavities for MEMS devices", Journal of Microelectromechanical Systems, vol. 9, No. 2, pp. 206-217, (Jun. 2000).

Wolf, et al., "Silicon Processing for the VLSI Era, vol. 1: Process Technology", $2^{nd}$ ed., Lattice Press, Sunset Beach, CA, chapter 11.8, pp. 475-477, (2000).

European Search Report dated Mar. 23, 2003 for European Patent Application No. EP 02 44 7270.

* cited by examiner

METHOD FOR THE CLOSURE OF OPENINGS IN A FILM

RELATED APPLICATIONS

This application hereby claims priority to and incorporates by reference in its entirety, co-pending U.S. Provisional Application No. 60/439,579 entitled "METHOD FOR THE CLOSURE OF OPENINGS IN A FILM", which was filed on Jan. 9, 2003. This application also claims priority to and incorporates by reference in its entirety, co-pending European Patent Application No. 02447270.6, which was filed on Dec. 24, 2002.

FIELD OF THE INVENTION

The present invention is related to microelectronic process technology. In particular it relates to Micro- and Nano-Electro Mechanical Systems (MEMS and NEMS) process technology. The present invention relates to a method for the closure of openings in a layer or film and to the encapsulation process of MEMS and NEMS.

BACKGROUND OF THE INVENTION

Many micro-electromechanical systems (MEMS) require an encapsulation under vacuum or under a controlled atmosphere and pressure to ensure either a good performance or an acceptable lifetime of operation. The encapsulation has to be performed without the deposition of sealing material on the MEMS device, which can cause damage to the device. In "The indent reflow sealing (IRS) technique—a method for fabrication of sealed cavities for MEMS devices", *J. MEMS*, 9, p. 206-217, 2000 by H. A. T. Tilmans, M. D. J. van de Peer and E. Beyne, which is incorporated by reference herein in its entirety, two approaches for wafer-scale zero-level packaging are mentioned.

The most popular approach is based on wafer bonding. Here, the sealing is performed by connecting two wafers (device wafer and capping wafer) together by means of a reflowable material. An example of such packaging is described in patent EP-A-0951069, which is incorporated by reference herein in its entirety. In this approach an expensive substrate, e.g. a Si wafer or a MEMS substrate, is used as a cap to close the cavity comprising the MEMS device. These wafers are thick and the sealing ring is large. Therefore, the resulting encapsulated MEMS device is space consuming. Moreover, batch processing is not possible.

Alternatively, encapsulation can be done by the fabrication and sealing of surface micro-machined membranes. The use of conformal LPCVD (low-pressure chemical vapour deposition) films is a known method for encapsulation at low pressure [C. Liu, Y. C. Tai, "Sealing of micro machined cavities using chemical vapour deposition methods: characterisation and optimisation", *J. MEMS*, 8, p. 135-145, 1999, which is incorporated by reference herein in its entirety]. The sealing of the cavity comprising the MEMS devices is done while depositing the conformal film. Hence, the atmosphere and pressure of the sealed MEMS device are those of the deposition chamber. Methods for sealing at higher pressures up to the order of atmospheric pressure and a few times that value, by the deposition of thin films, are however not widespread. Moreover, most of these atmospheric pressure techniques do not prevent material deposition inside the cavity.

MEMS devices can be very fragile and deposition of material on the device is preferably avoided. As disclosed in "Silicon processing for the VLSI era, vol. 1—Process Technology", $2^{nd}$ ed., 2000, S. Wolf and R. N. Tauber, chapter 11.8, pages 475-7, which is incorporated by reference herein in its entirety, hole filling may be performed by sputtering, e.g. in the formation of a via. This technique is not suitable for sealing cavities in which fragile devices are located, i.e. in cases in which the fragile device would be buried in the filling substance.

In EP0783108 A1, which is incorporated by reference herein in its entirety, a method is disclosed for the closure of openings in a membrane layer of, for instance, polycrystalline silicon which is covering a cavity. Hereby a layer of doped glass is deposited on the membrane layer, such that holes of certain dimensions are not closed but slightly narrowed. A temperature step is then applied, whereby the doped glass material further enters the cavity, creeping along the lower or inner surface of the film and later along the cavity walls, such that a layer of glass is formed covering the walls of the cavity. If the openings are small enough, the underlying cavity can be sealed by this temperature step, whereby the openings are completely filled with glass material.

In U.S. Pat. No. 6,337,499 B1, which is incorporated by reference herein in its entirety, trenches or holes in a substrate, called cavities, are sealed by depositing a layer of doped glass on top of the substrate, hereby narrowing the opening of the cavity. A reflow step is then performed whereby the cavity is sealed by the reflowed glass layer, which partially enters the cavity. Optionally, deposition of a passivation layer, having an substantially constant thickness of for instance 50 nm, is performed. It is considered desirable for the remaining cavity to have a constant width of about 1 µm over a depth T of typical 40 µm.

SUMMARY OF THE INVENTION

An aim of the present invention is to provide a method of sealing a opening, e.g. in a film above a cavity in a semiconductor cavity, which allows a greater freedom as to the atmosphere used during the sealing encapsulation as well as the resulting article. Preferably the sealing takes up less space. It is desirable for the encapsulation to avoid expensive processes or materials. Preferably the process should allow hermetic sealing of an opening. The closure of these openings can cause an underlying cavity to be hermetically sealed, in which an object can be isolated at a location.

The invention provides a method for closing openings in a layer or film, for example, in microelectronic process technology, whereby substantially no deposition material passes through the openings, which can be important if fragile micro devices are positioned under the openings. This sealing can be performed at controllable atmosphere and pressure. The closure of these openings can cause an underlying cavity to be hermetically sealed, in which an object can be isolated in a location. In particular the method provides a way for hermetically sealing cavities under controlled atmosphere and pressure in the encapsulation and sealing processes of cavities comprising fragile content. The cavities can comprise for instance Micro Electro Mechanical Systems (MEMS). The method can be used for encapsulating devices which may require a controlled atmosphere and pressure encapsulation such as micro accelerometers, micro gyroscopes, micro tubes, vibration micro sensors, micro mirrors, micro mechanical resonators or "resonant strain gauges", micro mechanical filters, micro switches, micro electrical circuits, micro relays, Integrated Circuits with air gaps etc.

The present invention provides a method for closing an opening in a layer or film with a reflow material, the method comprising:

depositing an intermediate layer onto the layer or film, which is stable during reflow and which narrows down the opening to be sealed due to collar or shoulder forming preferably by using a deposition method with a low bottom step-coverage. This bottom step coverage should be smaller than 1. Preferably this bottom step coverage is smaller than 70, or smaller than 50%.

depositing a reflow or sealing layer on said intermediate layer under a first set of pressure and atmosphere conditions to further partially close the opening, and reflowing said reflow or sealing layer under a second set of pressure and atmosphere conditions to close the opening by the reflow layer covering over the opening.

The reflowing step is preferably carried out at a temperature below 1000° C. The method in accordance with the present invention may be executed in such a way that it does not allow substantially any amount of reflow material to pass through the opening. In an embodiment of the invention, the openings are not completely filled after applying the method of the present invention.

In an embodiment of the present invention, the method may furthermore comprise depositing a wetting layer on the intermediate layer before depositing the reflow or sealing layer.

The span D of the opening may be larger than 0.5 μm but also larger than 1 μm and even larger than 2.5 μm. The span of the opening may be between 0.25 μm and 5 μm. Preferably, the span of the opening is between 0.5 μm and 2.5 μm and most preferably, the span of the opening is between 1 and 1.5 μm.

The opening in the film may be an opening above an underlying cavity in a substrate. The cavity may be part of a micro- or nano-electro-mechanical system (MEMS or NEMS). In one embodiment of the invention, the cavity may comprise a fragile device on which substantially no material may be deposited during the closure process to guarantee the proper working and lifetime of the device.

In one embodiment of the invention, the intermediate layer may be a dielectric layer. In a preferred embodiment, the intermediate layer may be formed by means of a chemical vapour deposition technique with low bottom step coverage.

The reflow or sealing layer may be deposited by an evaporation technique or a chemical or physical vapour deposition technique. In one embodiment, the reflow or sealing layer may be a conductive layer. The reflow or sealing layer may be planarised during or after reflow. In one embodiment the reflow or sealing layer may comprise aluminium. In a further embodiment, the reflow or sealing layer may comprise germanium.

In the method of the present invention, reflow may be performed at a temperature lower than at least one of the following:

the melting temperature of the substrate,
the melting temperature of the intermediate layer,
the melting temperature of the wetting layer and
a critical temperature of the device inside the cavity.

The cavity may be sealed under controlled atmosphere and pressure by reflowing the reflow or sealing layer under a second set of atmosphere and pressure conditions. The pressure during the reflow process may substantially be atmospheric pressure.

In one embodiment of the invention, the layer or film may comprise more than one opening and each of said openings may belong to a different cavity. The method of the invention may allow the openings to be closed simultaneously.

The method of the present invention may be used in a batch process.

These and other characteristics, features and advantages of the present invention will become apparent from the following detailed description, taken in conjunction with the accompanying drawings, which illustrate, by way of example, the principles of the invention. This description is given for the sake of example only, without limiting the scope of the invention. The reference figures quoted below refer to the attached drawings.

DETAILED DESCRIPTION OF THE INVENTION

The following description and examples illustrate preferred embodiments of the present invention in detail. Those of skill in the art will recognise that there are numerous variations and modifications of this invention that are encompassed by its scope. Accordingly, the description of preferred embodiments should not be deemed to limit the scope of the present invention.

Furthermore, the terms first, second, third and the like in the description and in the claims, are used for distinguishing between similar elements and not necessarily for describing a sequential or chronological order. It is to be understood that the terms so used are interchangeable under appropriate circumstances and that the embodiments of the invention described herein are capable of operation in other sequences than described or illustrated herein.

Moreover, the terms top, bottom, over, under and the like in the description and the claims are used for descriptive purposes and not necessarily for describing relative positions. It is to be understood that the terms so used are interchangeable under appropriate circumstances and that the embodiments of the invention described herein are capable of operation in other orientations than described or illustrated herein.

It is to be noticed that the term "comprising", used in the claims, should not be interpreted as being restricted to the structures or steps listed thereafter; it does not exclude other elements or steps. Thus, the scope of the expression "a device comprising means A and B" should not be limited to devices consisting only of components A and B.

When in the description or in the claims the term 'a controlled atmosphere' is used, a controlled constitution of ambient gas is meant. The notion of 'horizontal' is defined as substantially orthogonal to the direction of the earth's gravitational field.

In the present invention, a method for closing an opening or trench in a film is disclosed wherein substantially no closing material passes through the opening. For the purpose of this invention, the notion of 'substantially no material passing through the openings' should be understood as 'no or only a limited amount of material passing in and/or through the openings'. In the context of sealing of a cavity that comprises a fragile device, it should be such that the proper working of the device is not affected by the limited amount of material that may pass.

Figure 1:
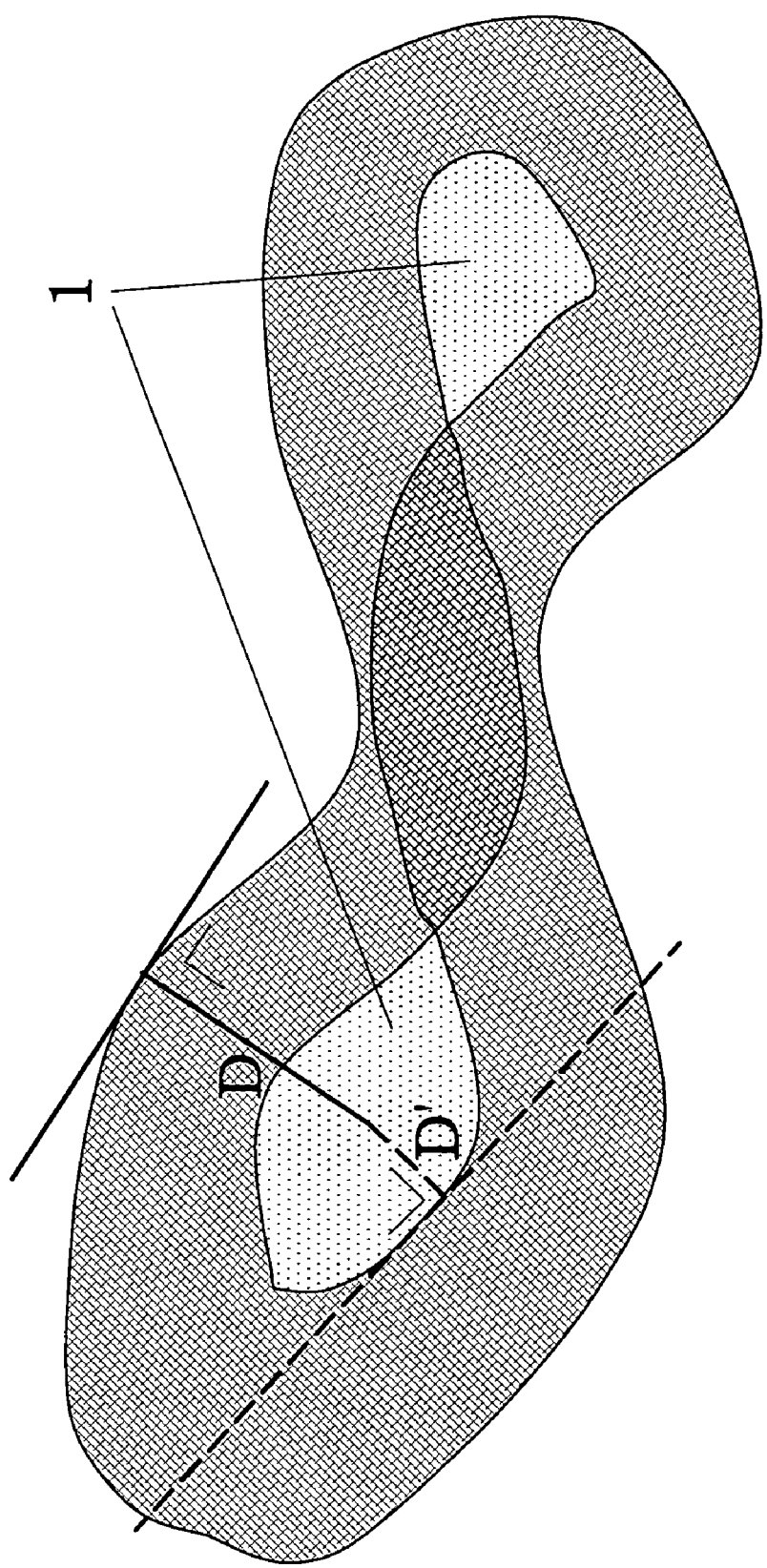
FIG. 1 illustrates the span of an opening in a layer of film.
Figure 2:
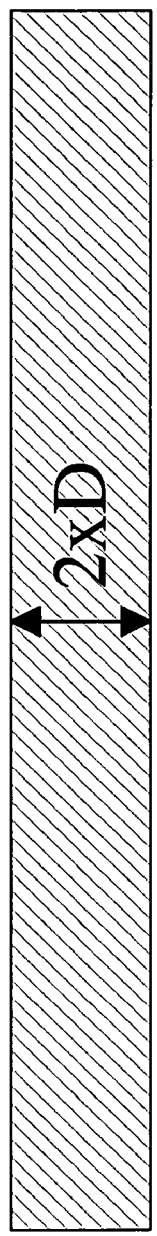
FIG. 2 illustrates the span in case of circular and rectangular openings.
Figure 2:
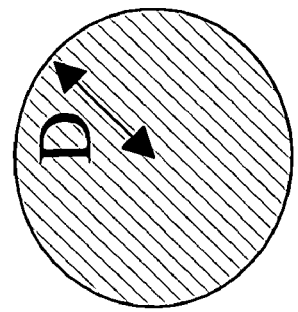

FIG. 1 illustrates the span of an opening in a layer of film. The openings in the film may be holes or trenches of different shapes. As shown in FIG. 1, an indicative measure for the dimensions of the opening is given by the parameter 'span' (D) which is defined as the minimum value of the distance, measured orthogonal to the contour of the opening, for which the coverage along the whole contour of the opening causes the complete opening to be closed. The areas 1 are uncovered parts of the opening, after a sealing or reflow layer is deposited on top of a film that comprises openings (see further). For example, for a circular opening, D corresponds to the radius of the opening and for a rectangular opening, D corresponds to half of the width of the opening. This is illustrated in FIG. 2.

The method of the present invention may preferably be used for closure of openings with a span D between 0.25 μm and 5 μm, but larger openings are not excluded. More preferably, the method may be used for openings with a span D between 1 μm and 2.5 μm.

Preferably, the method of the present invention may be used in the field of sealing techniques for wafer-scale zero-level packaging by thin film caps, for which it brings the additional advantage of hermetically sealing at a controlled atmosphere and pressure.

Figure 3:
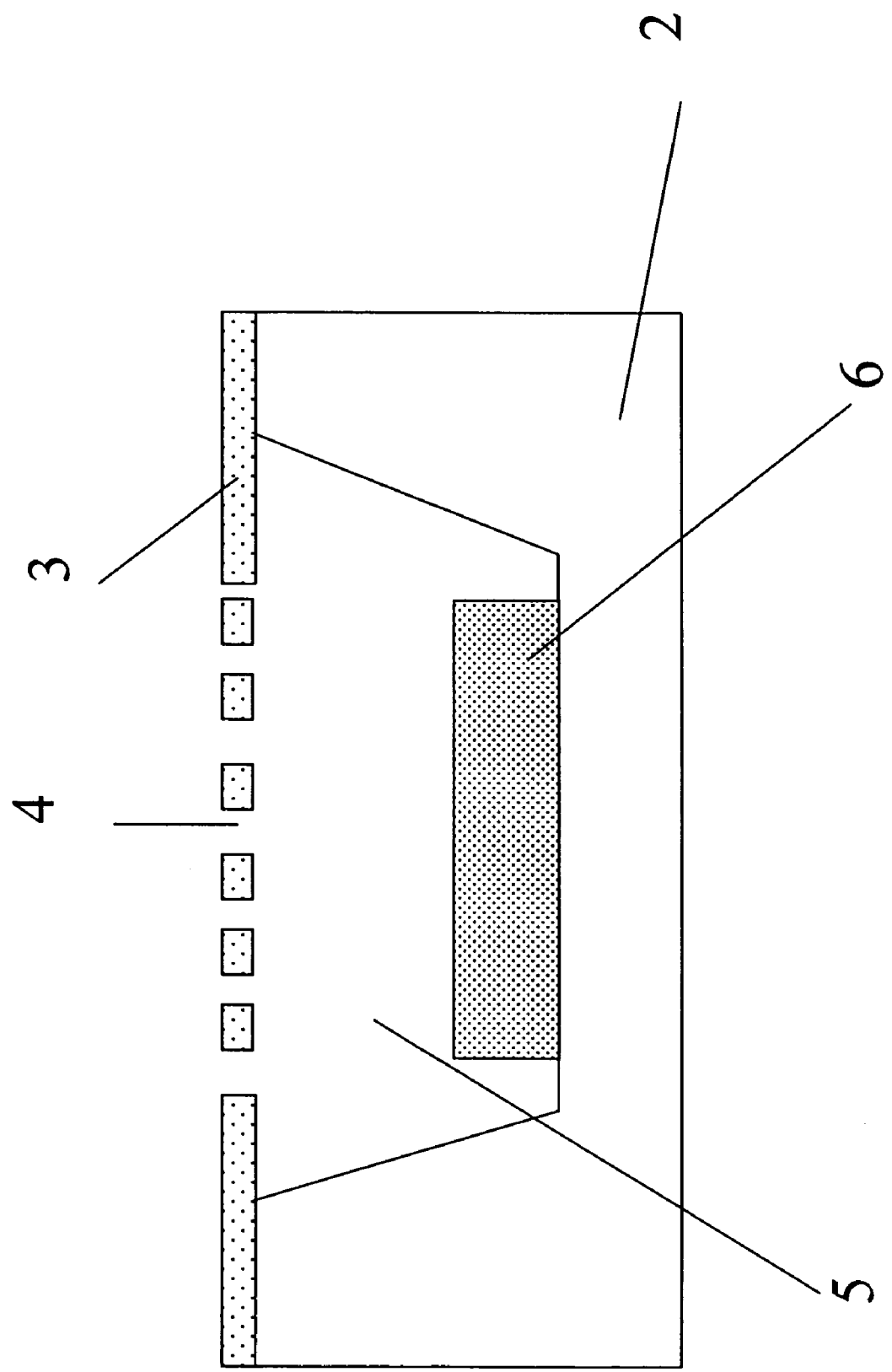
FIG. 3 shows a structure in which the invention may be applied in a fragile device, e.g., a MEMS device.

FIG. 3 shows a generic illustration of a device 6, located in a cavity 5 in a substrate 2, on which the method of the present invention may be applied. The substrate 2 and the film or membrane layer 3 may be any substrate 2 and film or membrane layer 3 used in MEMS processing. Examples of substrates 2, which may be used in the present invention, are for example single crystal or polycrystalline Si, single crystal or poly-crystalline Ge, glass, quartz, polymer, etc. Examples of suitable materials to form the film or membrane layer 3 are polycrystalline SiGe, metal films, oxide-based or nitride-based films, polymer, single crystal or polycrystalline Si, etc. The material of the film or membrane layer 3 may be conducting, insulating, semiconducting, etc. Furthermore, the fragile device 6, located in cavity 5, may be any MEMS device requiring a vacuum or controlled atmosphere and pressure encapsulation. Examples of such MEMS devices are micro-accelerometers, micro-gyroscopes, micro-tubes, vibration micro-sensors, micro-mirrors, micro-mechanical resonators or "resonant strain gauges", micro-mechanical filters, micro-switches, micro-electrical circuits, micro-relays, Integrated Circuits with air gaps etc.

Sealing the openings 4 in the film or membrane layer 3 may influence the atmosphere and pressure of the cavity 5.

Figure 4:
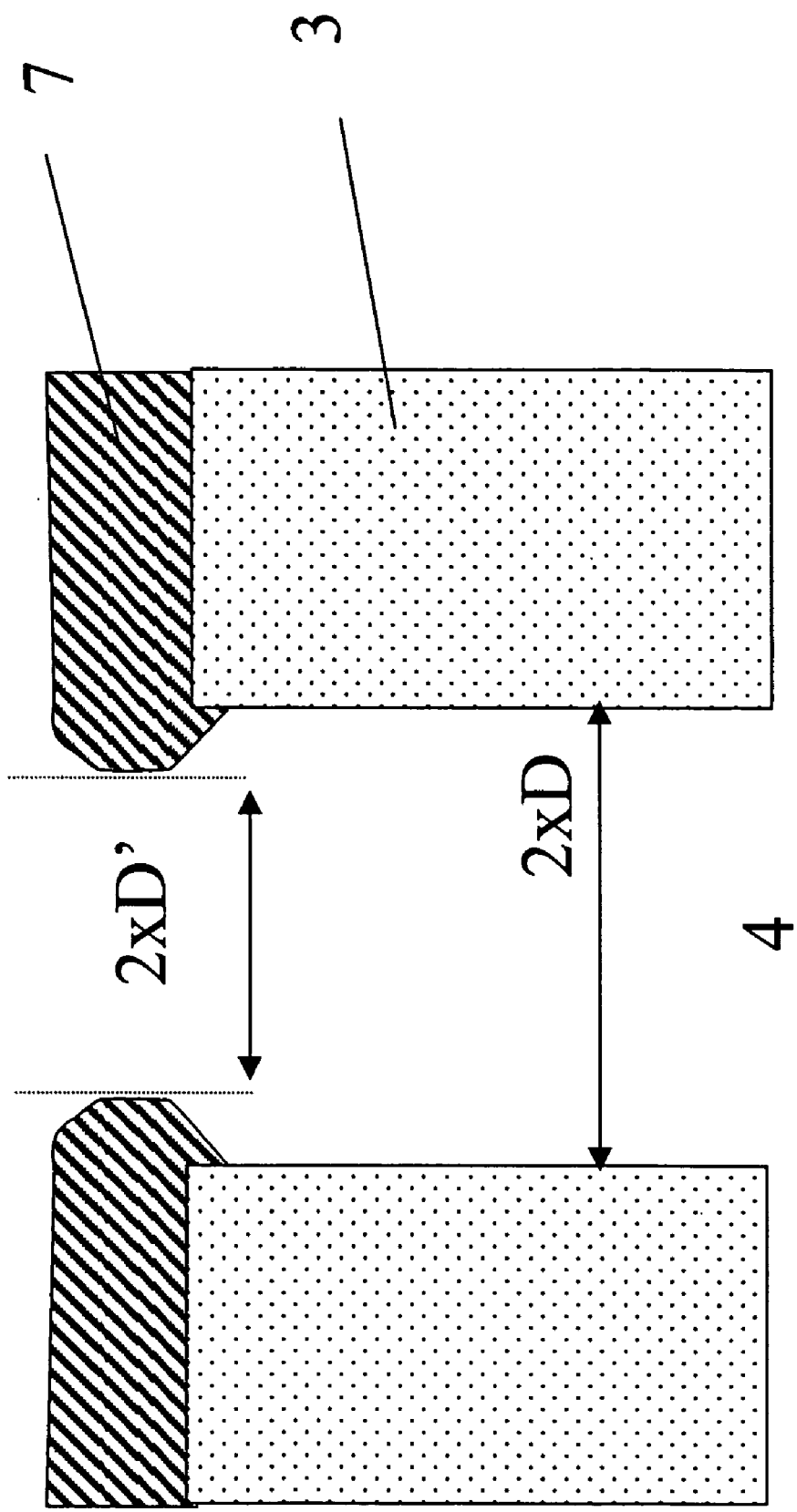
FIG. 4 shows a structure in accordance with a first embodiment of the present invention.

In a first embodiment of the invention, FIG. 4 shows a layer 7 having a low melting temperature material, also called sealing layer or reflow layer. The layer 7 is deposited on top of the film or membrane layer 3 that comprises openings 4, until the openings 4 are reduced in diameter up to being almost completely sealed. This layer 7 is preferably thin enough such that no actual closing of the cavity 5 occurs. By depositing this sealing layer 7, the span D of the original openings 4, may be reduced to a span D', where D'<D (see FIG. 1, where this is illustrated). D' indicates the span of an opening in the layer 7. For a rectangular opening, 2×D' corresponds to the width of the opening. D may for example be between 0.25 μm and 1 μm, D' may for example be between 0.03 μm and 0.05 μm or between 0.1 μm and 0.25 μm. The deposition of the sealing layer 7 may be performed under optimal conditions for deposition as for instance temperature, atmosphere and pressure conditions. These conditions may be optimal in the sense of avoiding deposition material of the. sealing layer 7 to pass through the openings. The material of the sealing layer 7 is then reflowed in a furnace with controlled atmosphere and pressure such that the openings, remaining after deposition of the sealing layer 7, are closed. This causes the underlying cavity 5 to obtain the atmosphere and pressure used for the reflow process. The reflow process does not cause substantially any amount of material to enter the openings 4. The reflow layer or sealing layer 7 can act as a functional layer of the device itself or of other devices.

In another embodiment, the invention provides a decoupling of the process of closing openings 4 in a film or membrane layer 3 and the process of sealing cavities 5 under predetermined atmosphere and pressure. For example, if a material would be deposited until the openings 4 are closed in a one step process and a controlled atmosphere and pressure would be required in the to be sealed cavity 5, the deposition conditions have to correspond with the required atmosphere and pressure in the cavity 5 after sealing. This limits the choice of deposition techniques, or limits the scope of possible atmospheres and pressures that may be required within the cavity 5. Especially, the amount of deposition material that is able to penetrate the openings 4 depends strongly upon the deposition conditions.

Figure 5:
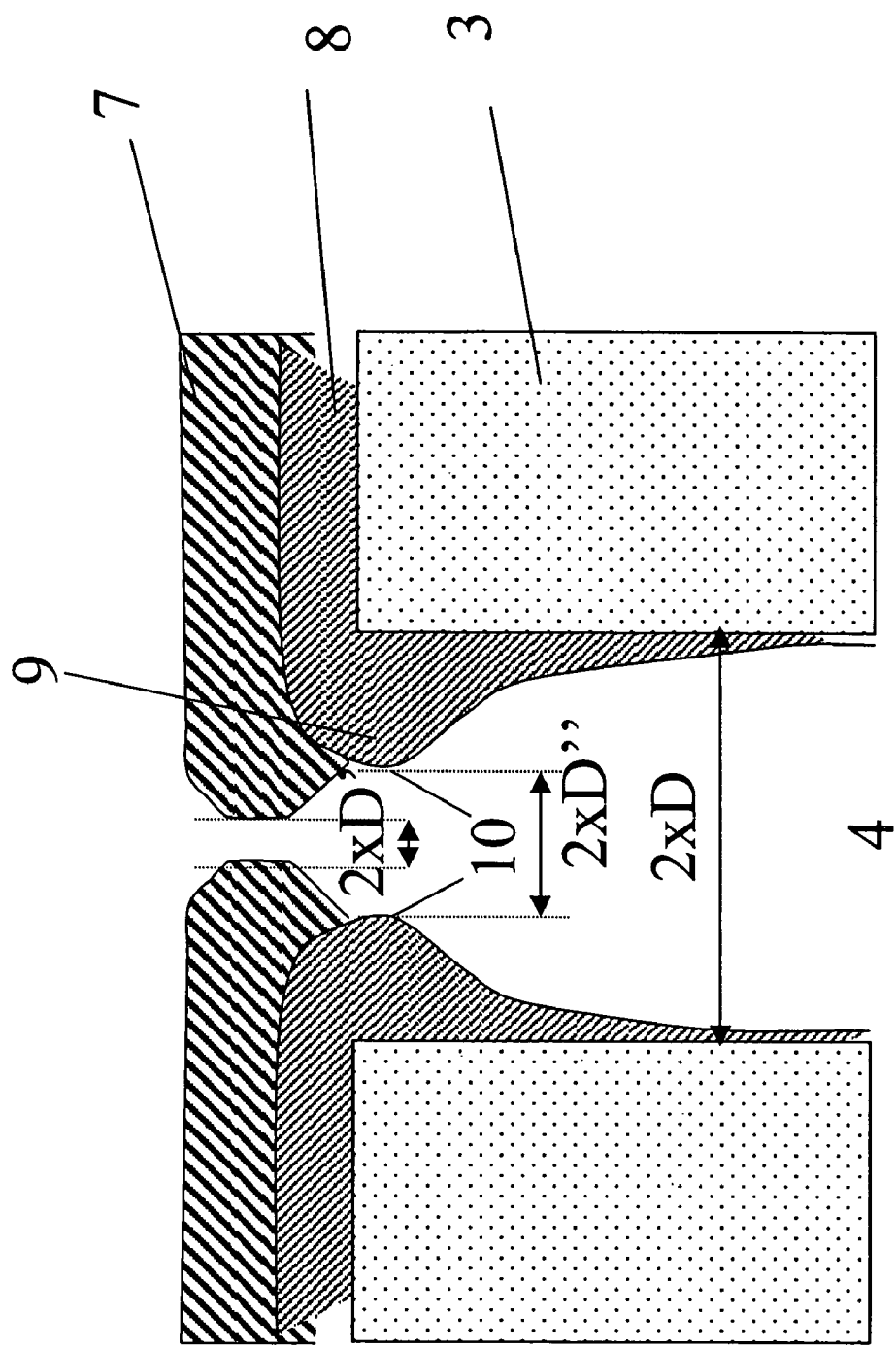
FIG. 5 shows a structure in accordance with second embodiment of the present invention.

FIG. 5 shows a second embodiment of the invention providing a method comprising depositing a first intermediate layer 8 in between the film or membrane layer 3 and the sealing layer 7. This first intermediate layer 8 can prevent reaction between the sealing layer 7 and film or membrane layer 3, is stable during reflow and narrows down the opening 4 to be sealed, due to formation of a collar or shoulder 9, which may be the result of using a deposition method with a low bottom step coverage. As is well known in the art, bottom step coverage generally refers to the ratio of the thickness of the deposited layer on the bottom of the opening to the thickness of the deposited layer at a surface surrounding the opening. The first intermediate layer 8 may preferably be a dielectric layer, e.g. a nitride layer or an oxide layer, and may, for example, be deposited by means of known chemical vapour deposition (CVD) methods with a low bottom step-coverage, such that collars or shoulders 9 are formed. Generally, it is desirable to have a bottom step coverage that is a ratio smaller than 100%. In one embodiment, the bottom step coverage may be smaller than 70%. In other embodiments, the bottom step coverage may be smaller than 20%, 10%, or 1%, depending on the dimensions of the openings, the deposition process used, and the requirements of the underlying device or cavity with respect to "contamination". This formation of a collar is commonly known in the art of depositing materials into openings 4 but normally measures are taken to avoid the problem of formation of such collar 9 on the top of the opening 4. Here, this narrowing effect is exploited such that when the reflow or sealing layer 7 is deposited, already smaller openings 4 (D"<D) are present. D" indicates the span of an opening in the first intermediate layer 8. For a rectangular opening, 2×D" corresponds to the width of the opening. The first intermediate layer 8 may insulate the later deposited sealing layer 7, which may be conductive, from the membrane layer 3. This first intermediate layer 8 may also promote the adhesion of the sealing or reflow layer 7 formed on this first intermediate layer 8.

After depositing the first intermediate layer 8, a reflow or sealing layer 7 may then be deposited. Any material that can be deposited and which can be reflowed at a temperature below the critical temperature of the whole device may be used. As is well known in the art, the phrase "critical temperature" generally refers to the temperature at which a device loses the ability to perform its functions properly. Suitable deposition techniques for the sealing layer 7 on top of the first intermediate layer 8 may for example be Physical or Chemical Vapour Deposition or evaporation. The sealing layer may, in this embodiment, for example be a metal (e.g., Ti, Ta, W, Al, Cu, Cr etc.), alloys, eutectic alloys, semiconductor materials (e.g., Ge) or solder materials (e.g., SnPb, In, Bi, etc).

The final sealing may then be done by performing a reflow step in a furnace in which the pressure and/or atmosphere may be controlled. The reflow temperature is normally a temperature somewhat below the bulk melting point of the material of the sealing layer 7, and may be, for example, between 30 and 100° C. below the bulk melting point of the material. Hence, materials should be selected such that the reflow temperature is preferably below the melting and evaporation temperatures of all the materials used. In other words, it is desirable to have the reflow temperature below the critical temperature of the complete device and package. In this embodiment, the reflow temperature is thus below the critical temperature of the substrate 2 comprising the fragile devices 6, e.g. MEMS devices, and below the critical temperature of this fragile device 6 itself. The viscosity of the material of the sealing layer 7 must be high enough such that the overlap or encroachment of the opening 4, corresponding to D", is at least maintained and that the material of the sealing layer 7 does not slide down along the sidewalls 10 of the opening 4. Preferably D'<D".

An aspect of the present invention can be planarisation during or after reflow, so that after the reflow of the sealing or reflow layer 7 a substantially flat surface may be achieved, which may be advantageous for further processing on top of the embedded device.

Figure 6:
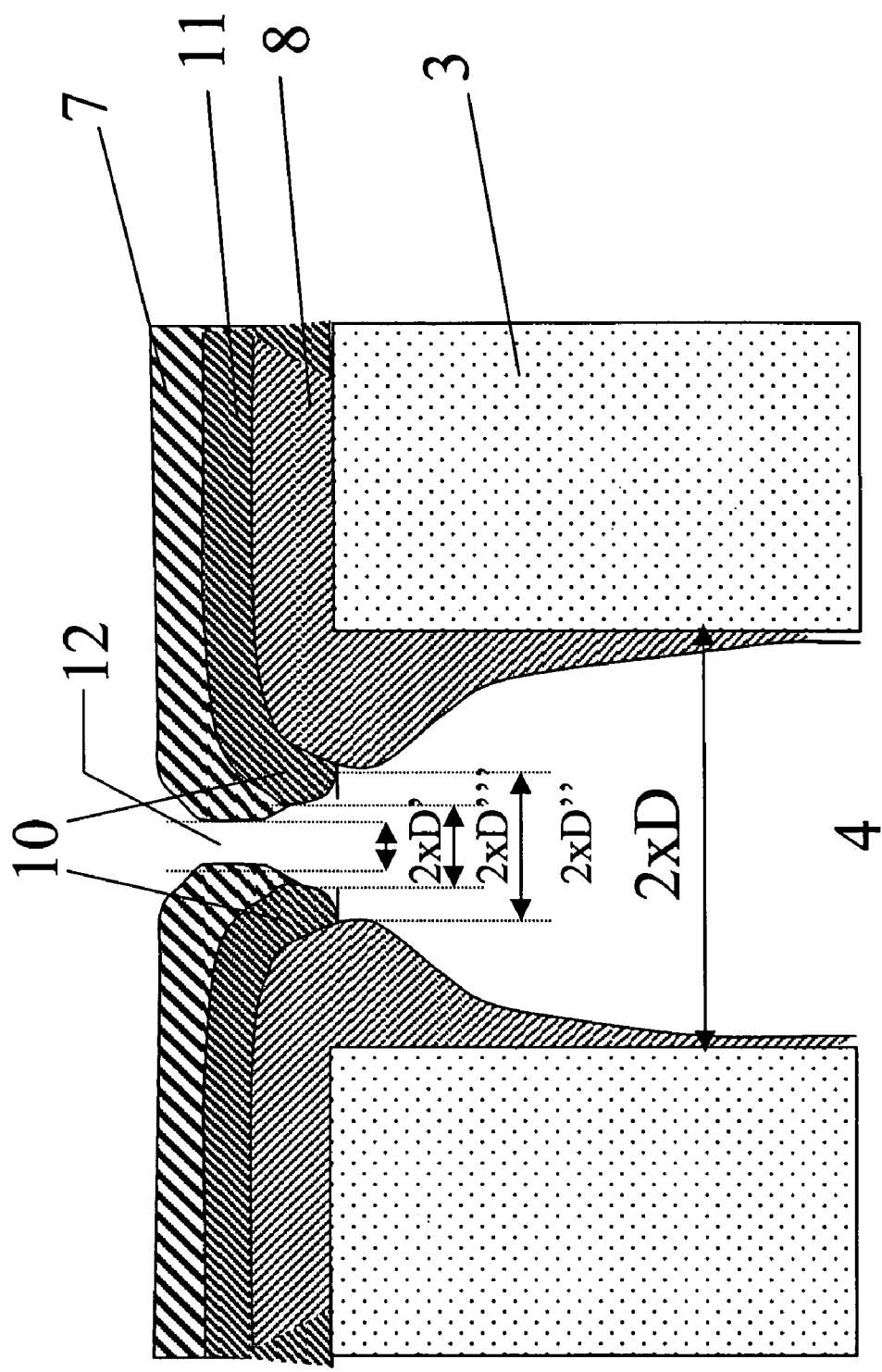
FIG. 6 shows a structure in accordance with third embodiment of the present invention.
Figure 7A:
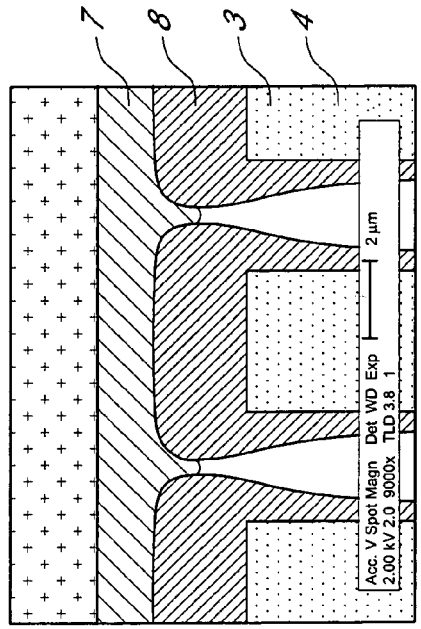
FIGS. 7(a), 7(b), 7(c), and 7(d) show actual pictures of the structure according to the second embodiment of the invention produced experimentally (1.5 μm evaporated Al on 2.2 μm PECVD $SiO_2$ on Si trenches before and after reflow).
Figure 7B:
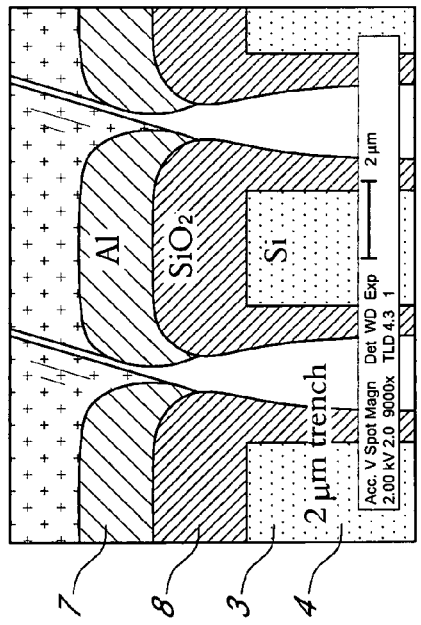
Figure 7C:
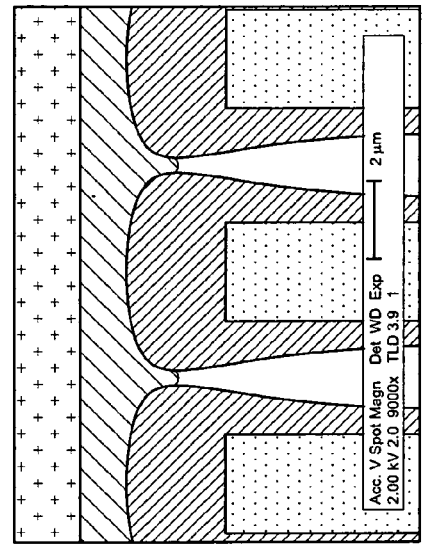
Figure 7D:
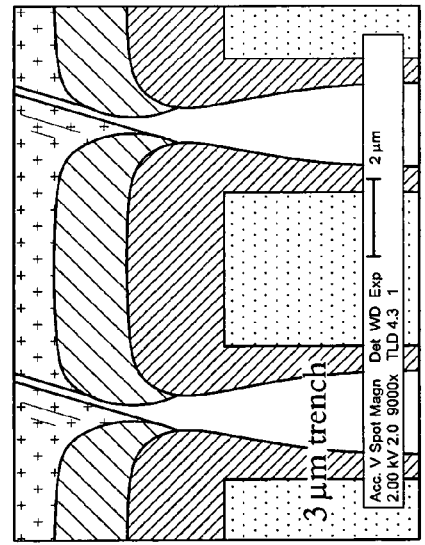

In a further embodiment of the present invention, FIG. 6 shows a second intermediate layer or wetting layer 11 may be formed between the sealing or reflow layer 7 and the first intermediate layer 8. The material of this wetting layer 11 may be chosen such that it is a good wetting layer 11 for the reflow of the reflow or sealing layer 7. For example, Ti may be used as a wetting layer 11 when Al is used as reflow layer 7. In this embodiment it is also the reflow or sealing layer 7 that will close the opening 4, the part corresponding to D', during the reflow process. A wetting layer 11, such as e.g. Ti or Ti-silicide, as wetting layer 11 for Al reflow, (see for example [Influence of Ti, TiN, and $TiSi_{2,4}$ under layers on Al—Si—Cu reflow sputtering, Proceeding of *VLSI multi-level interconnection conference*, 7-8 June, Santa Clara, USA, p. 336-342, 1994.]) may lower the reflow temperature. Thus, in case no wetting layer 11 is present, if the material of the first intermediate layer 8 forms a good wetting layer for the reflow of the sealing layer 7, reflow temperatures may be lowered.

The second intermediate layer 11 may assist in closing the opening 4, because during formation of this second intermediate layer 11 the opening 4 is further narrowed (D'"<D") (see FIG. 6). D'" indicates the span of an opening in the second intermediate layer 11. For a rectangular opening, 2×D'" corresponds to the width of the opening. The collar 10 thus formed will again prevent sliding down of the material of the reflow or sealing layer 7 along the sides of the opening 4, but will result in the piling up of the reflow material within the spacing, corresponding to D'", of the remaining openings 12 located between the parts of the wetting layer 11.

The 'reflow' at higher pressure, e.g., atmospheric pressure depends on the 'native oxide' film that is on, e.g., the sealing layer 7, which may in this embodiment comprise a metal. A 'protection layer', e.g. comprising Au, can prevent the formation of the 'native oxide'.

The atmosphere and the pressure inside the furnace can be used to determine the final pressure and atmosphere inside the cavity 5. Possible atmospheres are, for example, inert gasses such as He or Ar, nitrogen or other gasses such as oxygen. The pressure may preferably be any pressure between vacuum pressure (e.g. 10E-6 mbar) and a few times atmospheric pressure. More preferably, the pressure may be a pressure between vacuum pressure and 2 atm. Even more preferably, the pressure may be a pressure between vacuum pressure and 1.2 atm.

FIGS. 7(*a*) and 7(*c*) shows the device without annealing, while in FIGS. 7(*b*) and 7(*d*) the device is shown after reflow at 600° C., in accordance with another embodiment of the invention. In this embodiment, the reflow or sealing material is a metal, i.e. Al, which may, besides sealing the openings or trenches 4, be used as an electrical contact layer. An intermediate layer 8 of PECVD $SiO_2$ is deposited between the membrane layer 3, which in this embodiment is Si, and the sealing layer 7 is Al. Reflow is performed at 600° C. for 1 hour in a $N_2$ atmosphere at atmospheric pressure, closing the trenches 4 as can be seen in FIGS. 7(*b*) and 7(*d*). Substantially no material entered the trenches 4. This means that substantially no material would enter a cavity 5 located below said trenches 4.

Figure 8B:
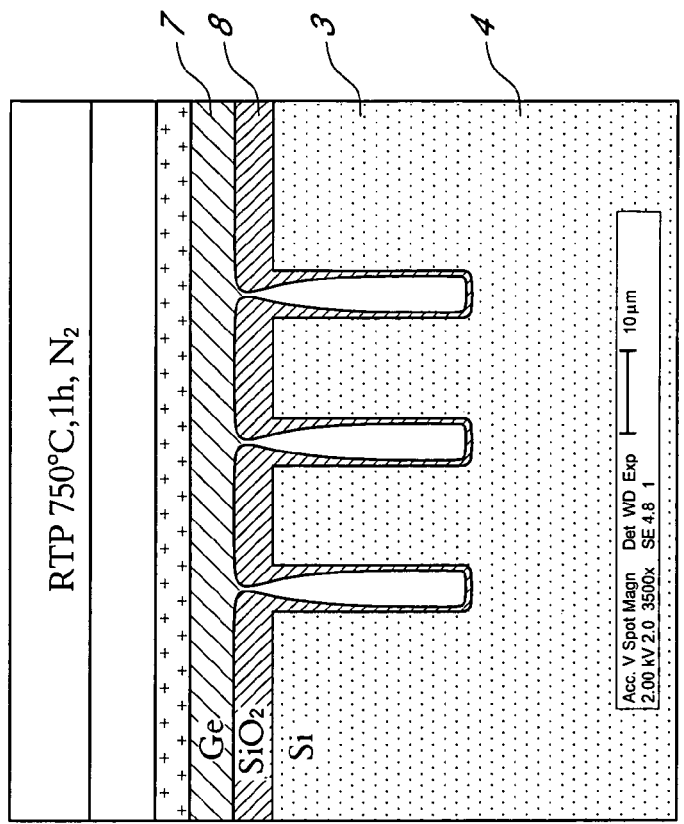
FIGS. 8(a) and 8(b) show actual pictures of the structure according to the second embodiment of the invention produced experimentally (2 μm PECVD Ge, 50 W, on 2.2 μm $SiO_2$ on Si trenches before and after reflow).
Figure 8A:
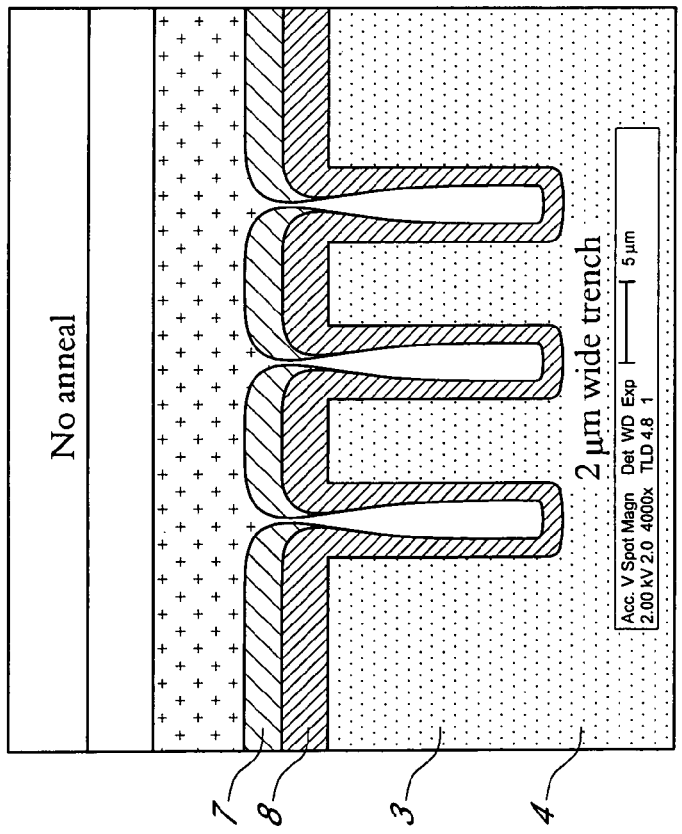

FIG. 8(*a*) shows a device without annealing in which PECVD Ge is deposited as a sealing layer 7 on top of an intermediate layer 8 of $SiO_2$. The Ge deposition is performed at a RF power of 50 W and reflow is performed at 750° C. for 1 hour in a $N_2$ atmosphere at atmospheric pressure. Different Ge thickness and annealing conditions may be applied. FIG. 8(*b*) shows the device after reflow. As shown in FIG. 8(*b*), 2 µm wide trenches 4 (about 10 µm deep) are closed by Ge. After reflow the surface of the device is substantially flat.

In a specific embodiment, trenches 4 of 2 µm width and 12 µm depth are produced in a substrate 2. On top of this substrate 2 a 2.5 µm thick layer of $SiO_2$ is deposited by PECVD. This results in a bottom step coverage of about 13%.

Experiments have shown that the narrowing towards almost-closure of openings 4 of a certain width 2D (within the dimensions claimed in this specification), may be achieved by the deposition of an intermediate layer 8 with a thickness slightly thicker than the width 2D; for example a thickness of about 125%×2D. The wider the openings 4 to be closed, the thicker the thickness of the intermediate layer 8 needs to be to achieve the narrowing towards almost-closure of the openings 4. In general, the thickness of the intermediate layer required for narrowing towards almost-closure of openings 4 is dependent on the deposition process and parameters used.

It is to be understood that although preferred embodiments, specific constructions and configurations, as well as materials, have been discussed herein for devices according to the present invention, various changes or modifications in form and detail may be made without departing from the scope and spirit of this invention.

What is claimed is:

1. A method of closing an opening in a film with a reflow material, the method comprising:
    depositing an intermediate layer on said film until a collar is formed wherein the collar narrows the opening and wherein the intermediate layer is substantially thermally stable during reflow;
    depositing a sealing layer on said intermediate layer under a first set of pressure and atmosphere conditions until said sealing layer partially closes the opening, and
    reflowing said sealing layer under a second set of pressure and atmosphere conditions,
    wherein said opening in the film comprises an opening above an underlying cavity, and wherein depositing the intermediate layer comprises depositing an intermediate layer so that no reflow material passes through said opening.

2. The method of claim 1, wherein said reflowing comprises reflowing said sealing layer until the sealing layer covers over the opening.

3. The method of claim 1, wherein depositing the intermediate layer comprises depositing with a bottom step coverage that is less than 70%.

4. The method of claim 3, wherein the bottom step coverage is less than 50%.

5. The method of claim 1, wherein said depositing a sealing layer comprises depositing a sealing layer so that no reflow material passes through said opening.

6. The method of claim 1, wherein said reflowing comprises partially filling the openings.

7. The method of claim 1, further comprising depositing a wetting layer on said intermediate layer before depositing said sealing layer.

8. The method of claim 1, wherein said opening has a span within the range of 0.25 µm and 5 µm.

9. The method of claim 1, wherein said opening has a span within the range of 0.5 µm and 2.5 µm.

10. The method of claim 1, wherein said opening has a span within the range of 1 µm and 1.5 µm.

11. The method of claim 1, wherein said cavity is in a substrate.

12. The method of claim 1, wherein said intermediate layer comprises a dielectric layer.

13. The method of claim 1, wherein depositing said intermediate layer comprises performing a chemical vapour deposition technique.

14. The method of claim 1, wherein depositing said sealing layer comprises evaporation.

15. The method of claim 1, wherein depositing said sealing layer comprises performing a chemical vapour deposition technique.

16. The method of claim 1, wherein depositing said sealing layer comprises performing a physical vapour deposition technique.

17. The method of claim 1, wherein said sealing layer comprises a conductive layer.

18. The method of claim 1, further comprising planarizing said sealing layer during reflow.

19. The method of claim 1, further comprising planarizing said sealing layer after reflow.

20. The method of claim 11, wherein the cavity comprises at least a part of a Micro-Electro-Mechanical System.

21. The method of claim 11, wherein the cavity comprises at least a part of Nano-Electro-Mechanical System.

22. The method of claim 11, wherein said reflowing comprises reflowing at a temperature lower than the melting temperature of the substrate.

23. The method of claim 11, wherein said reflowing comprises reflowing at a temperature lower than the melting temperature of said film.

24. The method of claim 11, wherein said reflowing comprises reflowing at a temperature lower than the melting temperature of said intermediate layer.

25. The method of claim 11, wherein said reflowing comprises reflowing at a temperature lower than the melting temperature of said wetting layer.

26. The method of claim 11, wherein said reflowing comprises reflowing at a temperature lower than a critical temperature of the device inside the cavity.

27. The method of claim 11, wherein reflowing said sealing layer under said second set of atmosphere and pressure conditions comprises sealing the cavity under controlled atmosphere and pressure.

28. The method of claim 1, wherein the pressure during the reflow process is at substantially atmospheric pressure.

29. The method of claim 11, wherein the cavity comprises a fragile device on which substantially no material is deposited.

30. The method of claim 1, wherein said film comprises a plurality of openings, each of the plurality of openings being located above a different cavity in a substrate, and wherein said openings are closed substantially simultaneously.

31. The method of claim 1, wherein the method is applied in a batch process.

32. The method of claim 1, wherein said sealing layer comprises aluminium.

33. The method of claim 1, wherein said sealing layer comprises germanium.

34. A method of closing an opening in a film with a reflow material, the method comprising:
    depositing an intermediate layer on said film until a collar is formed wherein the collar narrows the opening and wherein the intermediate layer is substantially thermally stable during reflow;
    depositing a sealing layer on said intermediate layer under a first set of pressure and atmosphere conditions until said sealing layer partially closes the opening; and
    reflowing said sealing layer under a second set of pressure and atmosphere conditions,
    wherein said opening in the film comprises an opening above an underlying cavity in a substrate.

* * * * *